United States Patent [19]

Severinsen

[11] 4,065,138
[45] Dec. 27, 1977

[54] METAL MESH STRIP AND EMBEDDED FIN GASKET FOR SHIELDING AGAINST ELECTROMAGNETIC INTERFERENCE

[75] Inventor: John Severinsen, Middletown, N.J.

[73] Assignee: Metex Corporation, Edison, N.J.

[21] Appl. No.: 774,805

[22] Filed: Mar. 7, 1977

[51] Int. Cl.² .............................................. F16J 15/00
[52] U.S. Cl. .............................. 277/230; 277/235 R; 156/244; 156/303.1; 156/324
[58] Field of Search .................... 277/229–232, 277/235 R, 235 A; 156/244, 303.1, 324

[56] References Cited

U.S. PATENT DOCUMENTS

| | | |
|---|---|---|
| 2,815,308 | 12/1957 | Robinson et al. ............... 156/244 X |
| 2,924,471 | 2/1960 | Poltorak et al. .................. 277/230 X |
| 2,991,208 | 7/1961 | Stieger ............................ 156/244 X |
| 3,594,250 | 7/1971 | Mueller-Tamm et al. .......... 156/244 |
| 3,781,021 | 12/1973 | Thomson et al. ................. 277/235 X |
| 3,846,608 | 11/1974 | Valles ............................. 277/230 X |
| 3,858,891 | 1/1975 | Trelease .......................... 277/229 |
| 3,889,043 | 6/1975 | Ducros ........................... 277/235 R X |

Primary Examiner—Robert S. Ward, Jr.

[57] ABSTRACT

A gasket for shielding against electromagnetic interference made from a metal mesh strip having a fin is disclosed. The fin is embedded in a layer of thin flexible material and the layer has a ribbon of thin flexible material affixed to either one or both sides. In the preferred form of the invention, the fin is embedded in a layer of soft plastic material and the layer has a ribbon of semi-rigid plastic material affixed to one or both sides. This invention also relates to a method and apparatus for making this gasket.

22 Claims, 7 Drawing Figures

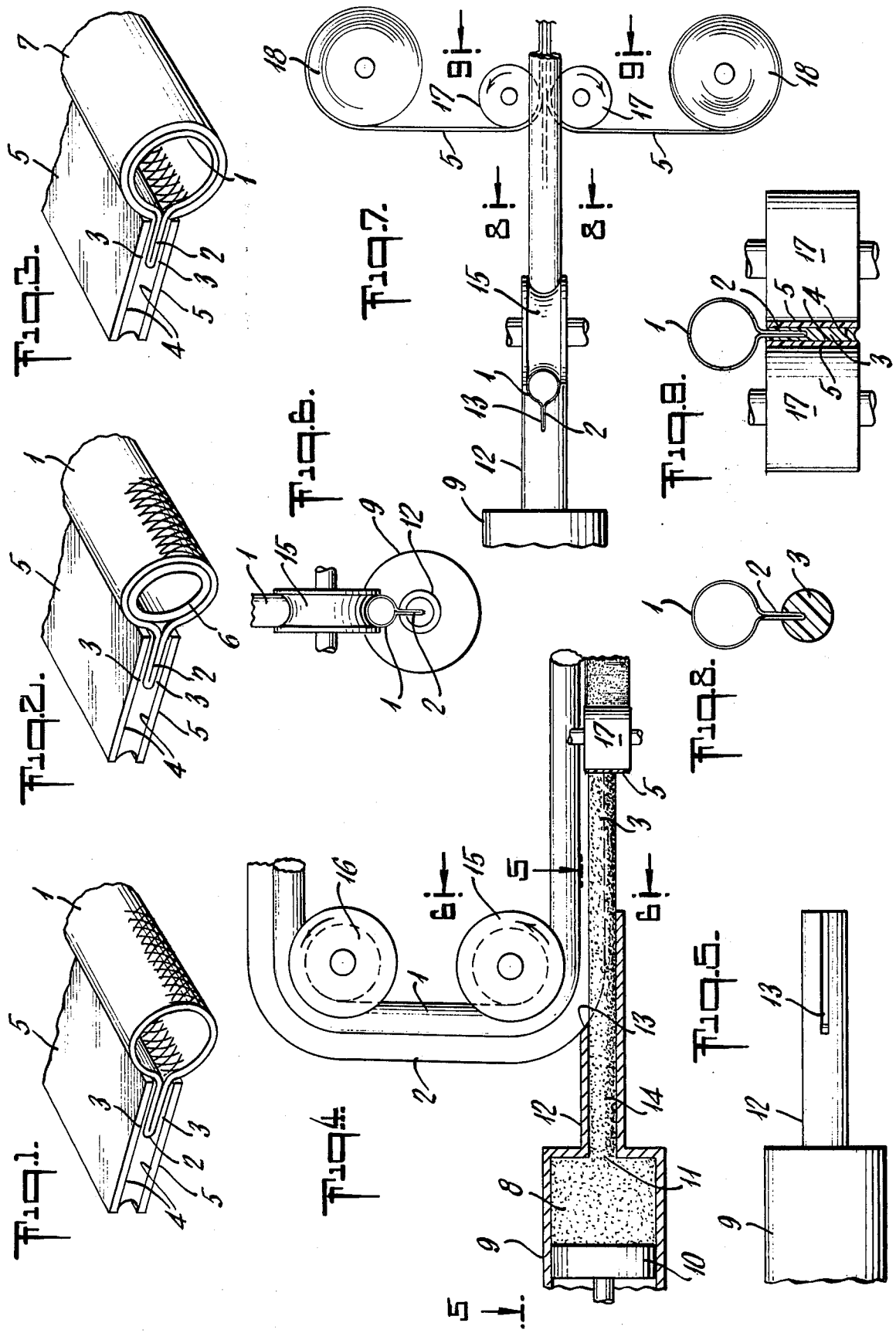

METAL MESH STRIP AND EMBEDDED FIN GASKET FOR SHIELDING AGAINST ELECTROMAGNETIC INTERFERENCE

BACKGROUND OF INVENTION

It is usually required that enclosures for electronic components be shielded against penetration of electromagnetic radiation, since such radiation often can affect the operation of the components within. The individual panels making up these enclosures are metal and thus absorb or reflect this radiation. However, leakage can occur at the interface between the panels, and especially past removable panels which are necessary to provide access to the components for repair and maintenance. It has been known in the art to insure a seal at this interface by using a gasket comprising metal mesh strip having a metal mounting fin which may also have an elastomer core. The gasket is attached by its fin portion to the sheet metal surface with rivets, screws, structural adhesives or in some instances, solder or welds.

In addition, it is known to use such strip without a fin, bonded directly to an adjacent strip of elastomer, whereby the elastomer is used as a means of attaching the strip to a sheet metal surface using adhesives or screws. Both the bonded and fin type gaskets are typically used when equipment enclosures are made from heavy gauge sheet metal that will not bow, flex or corrugate when riveted or screwed. Thin gauge sheet metal will flex adjacent such rivets and screws causing gaps at the interface. This is known as "oil canning" and can result in radiation leakage. Reinforcement of the thin gauge sheets at the point of attachment of the rivets or screws prevents "oil canning". In the past, such reinforcement has been provided by metal strip material welded or riveted to the sheet where the mesh strip is to be attached.

Close proximity screw or bolt clamp spacing to prevent "oil canning" is not practical since most of the electronic modules require servicing at very short intervals and only quick-disconnect type fastening arrangements may be used. The latter dictate the amount of contact pressure available along every inch of the strip gasket interface. At least five pounds pressure per linear inch of strip gasket is necessary for effective shielding.

The problem of "oil canning" with thin gauge sheet metal (typically 0.020 inches to 0.060 inches) has also been solved by an elastomer core or plain metal mesh strip having a fin embedded in the split edge of an aluminum extrusion strip. The aluminum strip served no shielding function, but is used solely to attach the gasket to the metal sheet and provide structural support to the adjacent thin gauge sheet to prevent "oil canning."

However, there are several drawbacks to this mesh-aluminum extrusion gasket. The major drawback to aluminum extrusion is its cost. It is expensive to manufacture initially and to replace. Unfortunately, the split edge or jaws of the aluminum extrusion are clamped together on the mesh fin and eventually cut their way through it. Also, pivotal motion of the mesh strip about the clamped fin eventually causes fatigue and ultimately failure of the mesh adjacent the jaws.

In addition, the aluminum extrusion gasket cannot be readily cut to size, welded and drilled while being mounted on the equipment panel. Consequently, all aluminum extrusion type strip gasketing must be formed into a picture frame construction at the gasket supplier's plant using welding, cutting and drilling machines during various stages of manufacture. Then, the completed frame must be chromium coated for surface protection prior to final application of the coat of paint. Packaging of these large frames requires several sheets of cardboard plus heavy-wall cardboard boxes to protect the frame during transport from the supplier's facility. Even with this extensive degree of protection, a large percentage of the frames arrive damaged and unusable and must be replaced by the gasket supplier. A further disadvantage of the aluminum extrusion gasket is that maximum fabrication length is about fifteen feet.

GENERAL DESCRIPTION OF THE INVENTION

Applicant's invention is a gasket for shielding against electromagnetic interference comprising a tubular metal wire mesh strip having a longitudinal fin. The fin is surrounded by a thin flexible layer having a durometer in the range of 60 – 75 according to ASTM specification standard testing method D-676. This layer has two major faces that are generally flat and parallel to the fin. A thin, generally flat flexible ribbon having a durometer in the range of 75 – 81 according to ASTM specification standard test method D-785 is affixed to one of the faces. Thus, the ribbon is always at least as stiff as the layer and is usually made stiffer to hold the rivets or screws and support the panel when the gasket is riveted or bonded to the panel. The layer is usually made more flexible than the ribbon to reduce fatigue on the fin. The fin, the layer, and the ribbon, in combination, form a flexible member which is thinner than the diameter of the tubular portion of the metal mesh strip.

In the various embodiments, the gasket may have a ribbon affixed to each of said two major faces, and said ribbon may be affixed by fusing it to the layer. In addition, the strip and fin may be of knitted wire. The tubular portion may have an elastomer core and may also be surrounded by a shell of soft extruded polyvinyl plastic.

In the preferred embodiment, the layer has a durometer of 72 ±/3 according to test method D-676 and the ribbon has a durometer of 78 ±/3 according to test method D-785. It is also preferred that the ribbon is affixed to each of the two major faces.

In the most preferred embodiment, the layer is soft polyvinyl chloride plastic and the ribbon is semi-rigid polyvinyl chloride plastic.

An apparatus for making the gasket of this invention, wherein a ribbon is affixed to each of the two major faces of the layer comprises a container for holding the layer material. The container has a means for heating the layer material to form an extrudable, soft substance. It also has an opening and a piston or other suitable device for forcing the soft substance through the opening. One end of a channel is positioned adjacent the opening for receiving the extruded substance and a grooved roller or other suitable means for pushing the fin into the channel is located just above the channel. A feed roller for supplying the strip and fin to the grooved roller is, in turn, located above the grooved roller. Opposed pressing rollers or other suitable means are positioned near the end of the channel remote from the opening for pressing the ribbon against each of the faces while the faces are still sufficiently tacky to permit the ribbon to adhere thereto. Storage rolls for feeding ribbon to the opposed rollers are appropriately positioned near the respective opposed roller.

In operation, the layer material is placed in the container, heated to form an extrudable, soft substance and then extruded by the piston through the opening into the channel. Then, the feed roller provides mesh strip and fin to the grooved roller which pushes the fin into the channel so that the fin is embedded in the extruded substance. Finally, the ribbons are unrolled from the storage rolls onto the opposed rollers and simultaneously pressed against each of the faces while the faces are still sufficiently tacky to permit the ribbon to adhere to them.

It will be appreciated that the end of the channel for receiving the extruded substance adjacent the opening may be connected thereto. Also, the top of the channel may be closed and have a slot formed on top adjacent the end of the channel remote from the opening. The slot will then receive the fin when it is to be embedded in the soft substance. In addition, the channel is preferably U-shaped and oriented in the horizontal plane.

Applicant's gasket has many advantages over those previously known. When riveted or bonded to thin sheet metal panels, the composite fin, layer and ribbon provides firm support for the panels and thus prevents "oil canning." The gasket is relatively inexpensive to manufacture, ship and install when compared with the aluminum strip. It has a longer operating life than the aluminum gasket, not only because the PVC plastic layer does not bite into the mesh fin as do the aluminum jaws, but also because the layer's flexibility reduces metal fatigue.

The gasket of this invention can be manufactured in continuous lengths and rolled up into coils of any desired length. It can be cut or notched with a portable electric iron during or just prior to attachment, or may be assembled into a picture frame gasket and then welded together at the ends with a portable electric plastic welder. The picture frame gasket can be welded either so that the fin lies inwardly and parallel to the plane defined by the rim, or so that the fin stands outwardly and perpendicular to the plane defined by the rim. The latter is known as a height-type gasket. A portable electric hot iron gun can easily contour a height-type gasket to fit an equipment panel edge.

The picture frame gaskets may be mounted on equipment panel edges, using structural adhesives applied in a continuous bead. Where silicon adhesives have been used, the gaskets may be readily removed by using proper silicon solvents. Mounting holes in a flat picture frame gasket may be obtained by using a portable electric hot iron rod.

The plastic extrusion gasket of this invention is far less expensive than the equivalent mesh aluminum extrusion gasket in bulk form or as a finished picture frame gasket. It does not require a surface primer as does the aluminum extrusion gasket and it can be manufactured in several matching colors so that it will not require a surface coat of paint. Since it is less expensive than the equivalent aluminum extrusion gasket, it can readily be discarded if not properly constructed during installation. Moreover, the plastic extrusion gasket presents a far more flexible cross section when formed into picture frame gaskets than the fragile aluminum extrusion picture frame gasket, and thus will accept higher impact loads without cracking. Consequently, fewer of the plastic extrusion gasket frames will be returned to the supplier for replacement.

The foregoing and other objects and advantages of the invention, as well as the basic characteristics thereof, including equivalents and substitutions therefor, are better understood by giving consideration to the detailed description to the various embodiments of the invention, including the method of making the gasket and the apparatus therefor.

In the accompanying drawings, in which like reference characters indicate like parts, FIG. 1 is a perspective view in section showing an embodiment of the invention wherein the tubular portion of the metal mesh strip has no core;

FIG. 2 is a view similar to FIG. 1 wherein the tubular portion has an elastomer core;

FIG. 3 is a view similar to FIG. 1 wherein the tubular portion of the metal mesh strip has a covering shell;

FIG. 4 is a partly schematic side view in section of the apparatus for manufacturing the gasket with some parts eliminated for clarity;

FIG. 5 is a sectional view along lines 5—5 of FIG. 4, with some parts eliminated for clarity;

FIG. 6 is a cross section along lines 6—6 of FIG. 4;

FIG. 7 is a plan view of the apparatus in section with some parts eliminated for clarity;

FIG. 8 is a cross section along lines 8—8 of FIG. 7, with some parts eliminated for clarity; and FIG. 9 is a cross section along lines 9—9 of FIG. 7, with some parts eliminated for clarity.

Referring to FIGS. 1 - 3, fin 2 of tubular wire mesh strip 1 is embedded in layer 3 having a durometer range of 60 - 75 according to ASTM test method D-676. Layer 3 has two major faces 4 to which flat ribbons 5 having a durometer range of 75 - 81 according to ASTM test method D-785 are affixed. The tubular wire mesh strip 1 may be provided with an elastomer core 6 and/or a soft polyvinyl chloride shell 7.

In the preferred embodiment, the layer 3 has a durometer of 72 ±/3 according to test method D-676 and ribbons 5 have a durometer of 78 ±/3 according to test method D-785.

In the most preferred embodiment, the layer 3 is soft polyvinyl chloride plastic and the flat ribbons 5 are semi-rigid polyvinyl chloride plastic.

Referring now to FIGS. 4 through 9, the apparatus for making the gasket according to FIG. 1 comprises a container 9 having piston 10. Opening 11 is in container 9 and closed channel 12 having a slot 13 on top is adjacent thereto. Grooved roller 15 is just above slot 13 and feed roller 16 is, in turn, above grooved roller 15. Opposed rollers 17 are located near the end of channel 12 remote from the opening 11. Storage rolls 18 are located next to opposed rollers 17 for continuously providing ribbons 5 thereto and a means (not shown) for heating container 9 associated therewith.

In operation, layer material is placed in container 9 and heated to form an extrudable soft substance 8. Piston 10 forces soft substance 8 through opening 11 to form a rope-like mass 14 in closed channel 12. Then, feed roller 16 feeds mesh strip 1 and fin 2 over grooved roller 15 which cooperates therewith so that fin 2 is pushed through slot 13 into mass 14.

Thus, when fin 2 continues downstream and exits from channel 12, it is surrounded by layer 3 having major faces 4. Then, ribbons 5 are unrolled from storage rolls 18 onto opposed rollers 17 and simultaneously pressed against faces 4 while faces 4 are still sufficiently tacky to permit ribbons 5 to adhere thereto.

What we claim is:

1. A gasket comprising a tubular metal wire mesh strip having a longitudinal fin; said fin being surrounded by a thin flexible layer; said layer having two major faces that are generally flat and parallel to said fin; a thin, generally-flat, flexible ribbon affixed to one of said faces, said ribbon being at least as stiff as said layer; the fin, the layer, and the ribbon forming a flexible member which is thinner than the diameter of the tubular portion of the metal mesh strip.

2. A gasket according to claim 1, wherein said ribbon is affixed to each of said two major faces.

3. A gasket according to claim 1 wherein the ribbon is fused to the layer.

4. A gasket according to claim 1 wherein the layer is soft polyvinyl chloride plastic and the ribbon is semi-rigid polyvinyl chloride plastic.

5. A gasket according to claim 1 wherein a shell of soft extruded polyvinyl plastic surrounds said tubular portion.

6. A gasket according to claim 1 wherein said layer has a durometer within the range of 60 – 75 according to ASTM specification testing method D-676 and said ribbon has a durometer within the range of 75 – 81 according to ASTM specification testing method D-785.

7. A gasket according to claim 1 wherein the layer has a durometer of 72 ±/3, according to said test method D-676 and said ribbon has a durometer of 78 ±/3, according to said test method D-785.

8. A gasket according to claim 6 wherein said ribbon has a higher durometer than said layer.

9. A gasket according to claim 8 wherein the difference between the durometer of said ribbon and said layer is at least 3.

10. A gasket according to claim 1 where said tubular portion is provided with an elastomer core.

11. A gasket according to claim 1 wherein said strip and said fin are of knitted wire.

12. A method of making the gasket of claim 1 which comprises heating said layer material to form an extrudable, soft substance, forcing said substance through an extruder to form a rope-like mass having a substantially U-shaped cross section, inserting said fin into said mass while said mass is still soft, and pressing said ribbon against one of said major faces of the layer, said pressing being performed when said one face is still sufficiently tacky to permit the ribbon to adhere to it.

13. A method of making a gasket according to claim 12 wherein the pressing is performed after the mass is substantially hard.

14. A method according to claim 12 wherein the other of said faces is pressed to form a generally flat face.

15. A method according to claim 12 wherein said ribbon is pressed against each of said faces.

16. A method according to claim 15 wherein said ribbon is simultaneously pressed oppositely against each of said faces.

17. An apparatus for making a gasket according to claim 2 which comprises a container for said layer material, means for heating said material to form an extrudable, soft substance in said container, an opening in said container, means for forcing said substance through said opening, a channel having two ends, one end of which is adjacent said opening for receiving the extruded substance, means for pushing said fin into said channel to embed said fin in said extruded substance, means for continuously providing said mesh strip and fin to said pushing means, means for pressing said ribbon against each of said faces, means for providing continuous ribbon to the pressing means.

18. Apparatus in accordance with claim 17 wherein said one end of the channel is connected to said opening.

19. Apparatus in accordance with claim 18 wherein said channel is closed and a slot is formed on top of said channel adjacent the other end thereto.

20. Apparatus in accordance with claim 17 wherein said channel is U-shaped.

21. Apparatus in accordance with claim 17 wherein said channel is horizontal.

22. Apparatus in accordance with claim 17 wherein said pressing means comprises opposed rollers.

* * * * *